United States Patent
Chen et al.

(10) Patent No.: US 11,121,092 B2
(45) Date of Patent: Sep. 14, 2021

(54) MARKING PATTERN IN FORMING STAIRCASE STRUCTURE OF THREE-DIMENSIONAL MEMORY DEVICE

(71) Applicant: YANGTZE MEMORY TECHNOLOGIES CO., LTD., Wuhan (CN)

(72) Inventors: Lin Chen, Wuhan (CN); Yunfei Liu, Wuhan (CN); Meng Wang, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 0 days.

(21) Appl. No.: 16/543,237

(22) Filed: Aug. 16, 2019

(65) Prior Publication Data

US 2020/0411446 A1 Dec. 31, 2020

Related U.S. Application Data (63) Continuation of application No. PCT/CN2019/093153, filed on Jun. 27, 2019.

(51) Int. Cl.
 H01L 23/544 (2006.01)
 H01L 21/32 (2006.01)
 (Continued)

(52) U.S. Cl.
 CPC ........ *H01L 23/544* (2013.01); *H01L 21/3213* (2013.01); *H01L 21/8221* (2013.01); *H01L 27/0688* (2013.01)

(58) Field of Classification Search
 CPC .............. H01L 23/544; H01L 27/0688; H01L 21/3213; H01L 21/8221; H01L 27/2481–249; H01L 27/11273–1128
 (Continued)

(56) References Cited

U.S. PATENT DOCUMENTS

| 6,486,954 B1 | 11/2002 | Mieher et al. |
| 2006/0148256 A1* | 7/2006 | Vinet ............ H01L 23/544 438/689 |

(Continued)

FOREIGN PATENT DOCUMENTS

| CN | 1932653 A | 3/2007 |
| CN | 101005061 A | 7/2007 |

(Continued)

OTHER PUBLICATIONS

International Search Report issued in corresponding International Application No. PCT/CN2019/093153, dated Mar. 27, 2020, 5 pages.

(Continued)

*Primary Examiner* — Sheikh Maruf
(74) *Attorney, Agent, or Firm* — Bayes PLLC (57) ABSTRACT

Embodiments of a marking pattern in forming the staircase structure of a three-dimensional (3D) memory device are provided. In an example, a semiconductor device includes a stack structure having a plurality of insulating layers and a plurality of conductor layers arranged alternatingly over a substrate along a vertical direction. In some embodiments, the semiconductor device also includes a marking pattern having a plurality of interleaved layers of different materials over the substrate and neighboring the stack structure. The marking pattern includes a central marking structure located in a marking area, the central marking structure dividing the marking area into a first marking sub-area farther from the stack structure and a second marking sub-area closer to the stack structure, a first pattern density of the first marking sub-area being higher than or equal to a second pattern density of the second marking sub-area.

20 Claims, 9 Drawing Sheets

(51) Int. Cl.
*H01L 21/82* (2006.01)
*H01L 21/3213* (2006.01)
*H01L 21/822* (2006.01)
*H01L 27/06* (2006.01)

(58) Field of Classification Search
USPC .......................................................... 257/686
See application file for complete search history.

(56) References Cited

U.S. PATENT DOCUMENTS

| | | | | |
|---|---|---|---|---|
| 2006/0286485 | A1* | 12/2006 | Cheng | H05K 1/113 |
| | | | | 430/313 |
| 2009/0230571 | A1* | 9/2009 | Chen | G03F 7/70633 |
| | | | | 257/797 |
| 2011/0049577 | A1 | 3/2011 | Or-Bach et al. | |
| 2012/0045901 | A1* | 2/2012 | Kim | H01L 21/0337 |
| | | | | 438/703 |
| 2012/0056329 | A1* | 3/2012 | Pagaila | H01L 21/486 |
| | | | | 257/774 |
| 2013/0328221 | A1* | 12/2013 | Tsai | G03F 9/7076 |
| | | | | 257/797 |
| 2014/0065736 | A1* | 3/2014 | Amir | G03F 7/70683 |
| | | | | 438/14 |
| 2014/0312458 | A1* | 10/2014 | Ashrafzadeh | H01L 25/0652 |
| | | | | 257/531 |
| 2015/0031191 | A1* | 1/2015 | Miyaki | H01L 23/544 |
| | | | | 438/462 |
| 2015/0079761 | A1* | 3/2015 | Lei | B23K 26/40 |
| | | | | 438/462 |
| 2015/0115413 | A1* | 4/2015 | Rudmann | H01L 27/1469 |
| | | | | 257/622 |
| 2015/0123270 | A1* | 5/2015 | Tsukiyama | H01L 25/0657 |
| | | | | 257/737 |
| 2015/0129968 | A1* | 5/2015 | Lin | H01L 27/0688 |
| | | | | 257/351 |
| 2015/0162295 | A1* | 6/2015 | Tseng | H01L 23/481 |
| | | | | 257/686 |
| 2015/0243643 | A1* | 8/2015 | Li | H01L 23/5226 |
| | | | | 438/109 |
| 2015/0279787 | A1* | 10/2015 | Kim | H01L 23/544 |
| | | | | 257/777 |
| 2015/0287692 | A1* | 10/2015 | Enquist | H01L 23/481 |
| | | | | 438/109 |
| 2015/0294978 | A1 | 10/2015 | Lu et al. | |
| 2015/0357240 | A1* | 12/2015 | Law | H01L 23/5286 |
| | | | | 438/109 |
| 2016/0013154 | A1* | 1/2016 | Ma | H01L 21/563 |
| | | | | 257/777 |
| 2016/0141271 | A1* | 5/2016 | Lee | H01L 21/565 |
| | | | | 257/712 |
| 2016/0149019 | A1* | 5/2016 | Chen | H01L 27/092 |
| | | | | 257/329 |
| 2016/0155722 | A1* | 6/2016 | Leedy | H01L 25/16 |
| | | | | 257/686 |
| 2016/0163686 | A1 | 6/2016 | Lee et al. | |
| 2017/0186767 | A1 | 6/2017 | Baek et al. | |
| 2017/0192333 | A1* | 7/2017 | Bergh | G02F 1/155 |
| 2017/0358594 | A1 | 12/2017 | Lu et al. | |
| 2019/0051610 | A1* | 2/2019 | Lu | H01L 21/31111 |
| 2019/0227446 | A1* | 7/2019 | Bijnen | G03F 9/7019 |
| 2020/0350258 | A1* | 11/2020 | Lee | H01L 23/544 |

FOREIGN PATENT DOCUMENTS

| | | |
|---|---|---|
| CN | 101034663 A | 9/2007 |
| CN | 106206545 A | 12/2016 |
| CN | 106847822 A | 6/2017 |
| CN | 107452717 A | 12/2017 |
| CN | 107818983 A | 3/2018 |
| CN | 109196644 A | 1/2019 |
| CN | 109786239 A | 5/2019 |
| CN | 109860201 A | 6/2019 |
| EP | 2 869 332 A1 | 5/2015 |
| TW | 201834018 A | 9/2018 |

OTHER PUBLICATIONS

Written Opinion of the International Searching Authority issued in corresponding International Application No. PCT/CN2019/093153, dated Mar. 27, 2020, 4 pages.

* cited by examiner

MARKING PATTERN IN FORMING STAIRCASE STRUCTURE OF THREE-DIMENSIONAL MEMORY DEVICE

CROSS-REFERENCE TO RELATED APPLICATIONS

This application is a continuation of International Application No. PCT/CN2019/093153, filed on Jun. 27, 2019, entitled "MARKING PATTERN IN FORMING STAIRCASE STRUCTURE OF THREE-DIMENSIONAL MEMORY DEVICE," which is hereby incorporated by reference in its entirety.

BACKGROUND

Embodiments of the present disclosure relate to a marking pattern in forming the staircase structure of a three-dimensional (3D) memory device.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. 3D memory architecture includes a memory array and peripheral devices for controlling signals to and from the memory array.

SUMMARY

Embodiments of a marking pattern in forming the staircase structure of a 3D memory device are disclosed.

In one example, a semiconductor device includes a stack structure having a plurality of insulating layers and a plurality of conductor layers arranged alternatingly over a substrate along a vertical direction. In some embodiments, the semiconductor device also includes a marking pattern having a plurality of interleaved layers of different materials over the substrate and neighboring the stack structure. The marking pattern includes a central marking structure located in a marking area, the central marking structure dividing the marking area into a first marking sub-area farther from the stack structure and a second marking sub-area closer to the stack structure, a first pattern density of the first marking sub-area being higher than or equal to a second pattern density of the second marking sub-area.

In another example, a marking pattern for controlling a trimming rate of a photoresist trimming process includes a plurality of interleaved layers, the plurality of interleaved layers including at least two layers of different materials stacking along a vertical direction over a substrate. In some embodiments, the marking pattern also includes a central marking structure that divides the marking area into a first marking sub-area farther from a device area and a second marking sub-area closer to the device area, a first pattern density of the first marking sub-area being higher than or equal to a second pattern density of the second marking sub-area.

In a different example, a method for forming a semiconductor device includes the following operations. First, a device area and a marking area neighboring the device area over a dielectric stack are determined, the dielectric stack including a plurality of insulating material layers and a plurality of sacrificial material layers arranged alternatingly over a substrate. The device area and the marking area may be patterned using a same etching process to form a marking pattern having a central marking structure in a marking area and a staircase pattern in the device area. The marking pattern and the staircase pattern may have a same thickness equal to a thickness of at least one insulating material layer and one sacrificial material layer and the central marking structure divides the marking area into a first marking sub-area farther from the device area and a second marking sub-area closer to the device area. A first pattern density of the first marking sub-area may be greater than or equal to a second pattern density of the second marking sub-area. A photoresist layer may be formed to cover the staircase pattern and expose the marking pattern, and the photoresist layer may be trimmed to expose a portion of the dielectric stack along a horizontal direction. An etching process may be performed to maintain the marking pattern and remove the exposed portion of the dielectric stack and form a staircase.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Embodiments of the present disclosure will be described with reference to the accompanying drawings.

DETAILED DESCRIPTION

Although specific configurations and arrangements are discussed, this should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

As used herein, the term "nominal/nominally" refers to a desired, or target, value of a characteristic or parameter for a component or a process operation, set during the design-phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, a staircase structure refers to a set of surfaces that include at least two horizontal surfaces (e.g., along x-y plane) and at least two (e.g., first and second) vertical surfaces (e.g., along z-axis) such that each horizontal surface is adjoined to a first vertical surface that extends upward from a first edge of the horizontal surface, and is adjoined to a second vertical surface that extends downward from a second edge of the horizontal surface. A "step" or "staircase" refers to a vertical shift in the height of a set of adjoined surfaces. In the present disclosure, the term "staircase" and the term "step" refer to one level of a staircase structure and are used interchangeably. In the present disclosure, a horizontal direction can refer to a direction (e.g., the x-axis or the y-axis) parallel with the top surface of the substrate (e.g., the substrate that provides the fabrication platform for formation of structures over it), and a vertical direction can refer to a direction (e.g., the z-axis) perpendicular to the top surface of the structure.

In the present disclosure, a staircase structure can be formed from a dielectric stack that includes a plurality of alternatingly arranged dielectric pairs (e.g., insulating material layer/sacrificial material layer pair) by repetitively etching the dielectric pairs using an etch mask, e.g., a PR layer over the dielectric stack layer. The insulating material layer and the underlying sacrificial material layer in one dielectric pair can have the same or different thicknesses. In some embodiments, one or more dielectric pairs can form one step. During the formation of the staircase structure, the PR layer is trimmed (e.g., etched incrementally and inwardly from the boundary of the dielectric stack layer, often from all directions) and used as the etch mask for etching the exposed portion of the dielectric stack. The amount of trimmed PR can be directly related (e.g., determinant) to the dimensions of the staircases. The trimming of the PR layer can be obtained using a suitable etch, e.g., an isotropic dry etch or a wet etch. One or more PR layers can be formed and trimmed consecutively for —the formation of the staircase structure. Each dielectric pair can be etched, after the trimming of the PR layer, using suitable etchants to remove a portion of both the insulating material layer and the underlying sacrificial material layer. The etched insulating material layer and the sacrificial material layers are referred to as insulating layers and sacrificial layers. After the formation of the staircase structure, the PR layer can be removed and the sacrificial layers can be replaced with metal/conductor layers (e.g., tungsten). The metal/conductor layers can form the gate electrodes (or word lines) of the 3D memory device.

In the fabrication of 3D memory devices, an etch mask, e.g., a PR layer, is often employed for the etching and formation of 3D features such as staircases. For example, the PR layer is formed to cover a device area and is repetitively trimmed to expose a portion of the device area. The exposed portion of the device area can then be removed. The PR layer can be repetitively trimmed in a fabrication process for the formation of a number of staircases. To meet the demands in higher storage capacity, more memory cells are desired in a 3D memory device. One approach to form an increased number of memory cells is to increase the number of staircases stacking over a substrate of the 3D memory device for the formation of more conductor layers (i.e., gate electrodes) and thus more memory cells. A thicker etch mask is then needed for the formation of the staircases. To ensure the etch mask is trimmed at a desired rate (e.g., so the staircases can have desired dimensions) marking patterns are used to monitor/control the trimming rate of the etch mask during and/or after the trimming process. In an example, a distance between a marking pattern and the PR layer is measured (e.g., repeatedly) in real time to determine and/or monitor the trimming rate of the PR layer.

However, in the existing fabrication process of a 3D memory device, a marking pattern often includes a single marking structure in a marking area neighboring a device area where a stack structure of a plurality of staircases are formed. The pattern density (e.g., a percentage of surface area occupied by features) of the device area can be different from the pattern density of the marking area, causing loading effect (e.g., the difference in etch rate caused by the difference in pattern density) to take place. For example, the pattern density of the device area can be higher than the pattern density of the marking area, causing the etch rate on the marking pattern to be faster than desired. Also, the higher pattern density of device area can cause the marking pattern to be unevenly etched during the formation of the staircases. The resulted marking pattern can "shift" horizontally (e.g., along the x-direction). The change in the horizontal location of the marking pattern can cause the measurement of distance (e.g., along the horizontal direction) between the marking pattern and a staircase to have reduced precision.

Figure 1A:
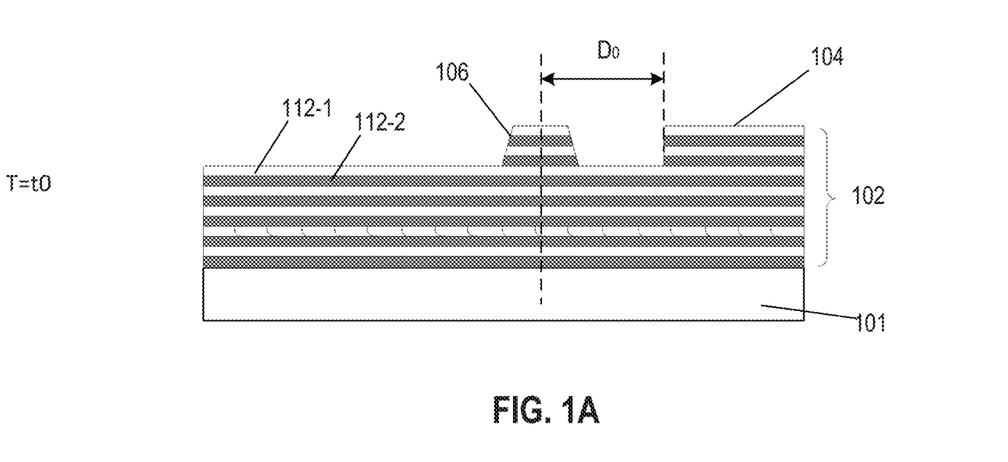
FIG. 1A illustrates a cross-sectional view of a marking pattern used for photoresist (PR) trimming rate control in forming a 3D memory device at time t0.
Figure 1B:
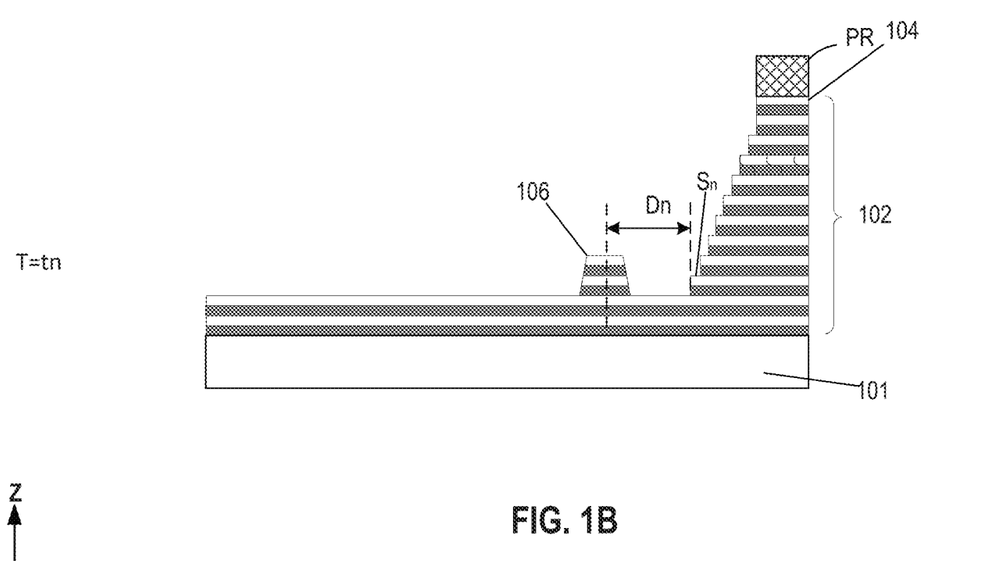
FIG. 1B illustrates a cross-sectional view of the marking pattern at time tn.

FIGS. 1A and 1B illustrate the issue. At the beginning (T (time)=t0) of a fabrication process, a marking pattern 106 is formed at the same with a staircase pattern 104 at a top portion of a stack structure 102. Stack structure 102 is over a substrate 101. Stack structure 102 includes a stack of interleaved insulating material layers 112-1 (e.g., silicon oxide) and sacrificial material layers 112-2 (e.g., silicon nitride) arranged vertically (along the z-axis) over substrate 101. Stack structure 102 is patterned to form marking pattern 106, which includes a single marking structure neighboring a staircase pattern 104. The horizontal location of marking structure 106 is reflected by a distance Do from an edge of staircase pattern 104 to the central line (e.g., along the horizontal direction or the x-direction) of marking structure 106. The position of the edge of staircase pattern 104 can be transferred to the position of the edge of a bottom staircase in subsequent staircase-forming process. The central line of marking structure 106 can be used as a reference for determining a trimming rate of a PR layer in the etching of the staircases.

After the formation of marking structure 106, a PR layer (e.g., "PR" in FIG. 1) is formed to cover staircase pattern 104. The PR layer is repetitively trimmed to expose portions of stack structure 102. The exposed portions of stack structure 102 are repetitively etched away to form a plurality of staircases stacking along substrate 101 along the vertical direction. As shown in FIG. 1B, after several staircases are formed (e.g., at T=tn), the loading effect already causes a noticeable difference between etching profile of marking pattern 106 on the side farther away from the staircases and the etching profile of marking pattern 106 on the side closer to the staircases. Marking structure 106 "shifts" away from its original horizontal location at T=t0, as shown by a decreased distance between the central line of marking structure 106 and the edge of bottom staircase $S_n$, as reflected by a distance $D_n$ between the central line of marking structure 106 and the edge of the bottom staircase $S_n$. The dimensions of marking structure 106 are also reduced at least along the horizontal direction. Marking structure 106 thus can cause an error when used for the measuring of trimming rate of the PR.

Various embodiments in accordance with the present disclosure provide marking patterns and a method for photoresist trimming rate control in forming a three-dimensional (3D) memory device. Using the structures and method, a marking structure (also a central line of the marking structure) is less likely to shift horizontally during the etching of staircases, increasing the precision in trimming rate control of the PR layer. A marking pattern is provided to compensate/reduce the loading effect on the marking structure, which is part of the marking pattern. Specifically, the marking pattern can reduce the difference between the etch rates on the side farther away from the staircases and on the side closer to the staircases. The etching of the marking structure can have increased symmetry, reducing the horizontal "shift" of the marking structure in the formation of staircases. In some embodiments, the marking pattern is formed from the etching of a stack structure that includes a plurality of interleaved layers of insulating material and sacrificial material. In some embodiments, each marking structure of the marking pattern includes at least one layer of the insulating material and at least one layer of the sacrificial material, interleaved along the vertical direction (e.g., the z-axis).

Figure 2:
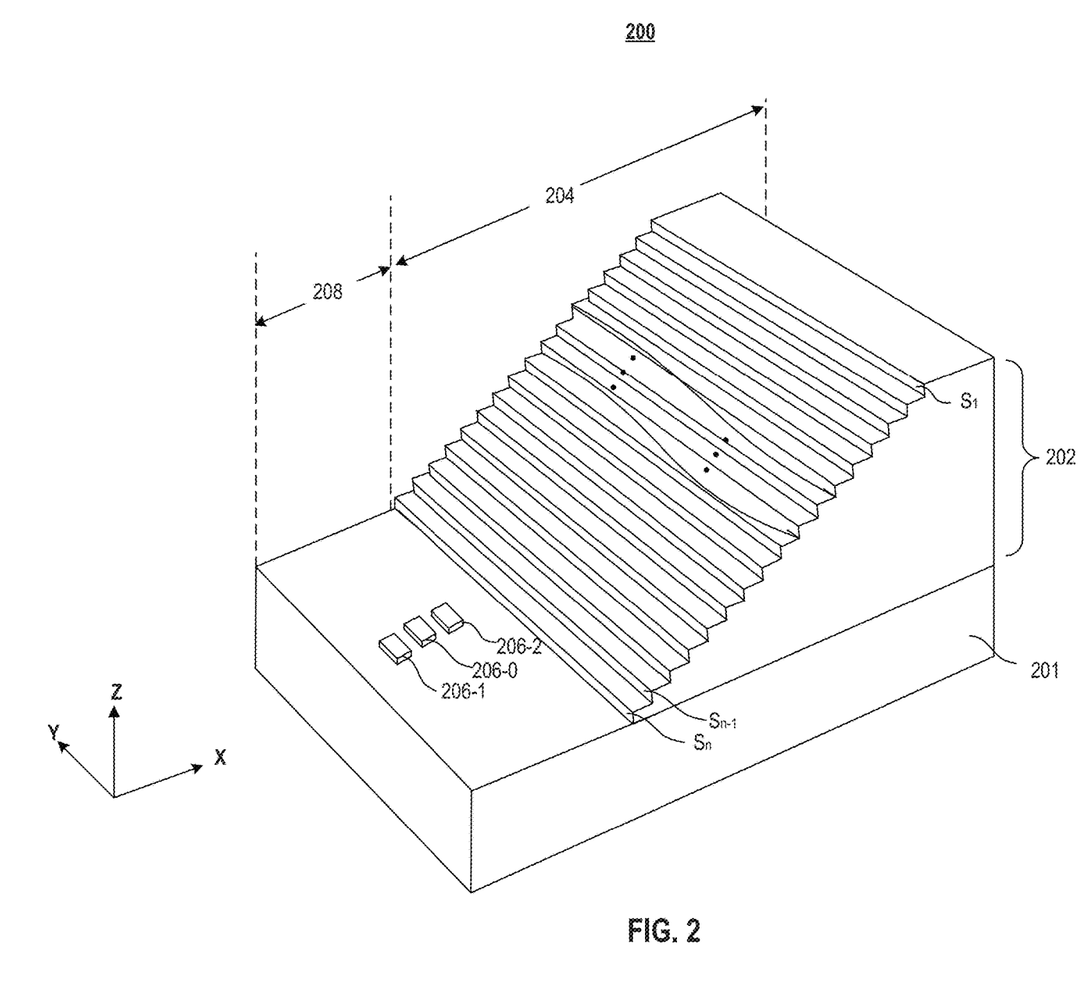
FIG. 2 illustrates a 3D memory device and a marking pattern, according to some embodiments of the present disclosure.

FIG. 2 illustrates a structure 200 having a stack structure 202 and a marking pattern 206 neighboring stack structure 202 over a substrate 201, according to some embodiments. Structure 200 can be formed after the etching of all the staircases is completed. In some embodiments, stack structure 202 is formed in a device area 204 and marking pattern 206 is formed in a marking area 208 neighboring device area 204. Substrate 201 can include any suitable material for forming a 3D memory device. For example, substrate 201 can include silicon, silicon germanium, silicon carbide, silicon on insulator (SOI), germanium on insulator (GOI), glass, gallium nitride, gallium arsenide, and/or other suitable III-V compounds.

Stack structure 202 can include a plurality of interleaved insulating layers and sacrificial layers arranged vertically (along the z-axis) over substrate 201. In some embodiments, each insulating layer and a corresponding sacrificial layer form a staircase. The corresponding sacrificial layer can be directly on top of the insulating layer or directly underlying the insulating layer. For ease of description, in the present disclosure, a staircase includes an insulating layer and an underlying sacrificial layer. In some embodiments, stack structure 202 includes a plurality of staircases ($S_1, \ldots, S_{n-1}$, $S_n$) stacking over substrate 201. In some embodiments, the sacrificial layers are subsequently replaced with conductor layers for forming a plurality of word lines of the 3D memory device. In some embodiments, sacrificial layers include any suitable material different from insulating layers. For example, sacrificial layers can include poly-crystalline silicon, silicon nitride, poly-crystalline germanium, and/or poly-crystalline germanium-silicon. In some embodiments, sacrificial layers include silicon nitride. Insulating layers can include any suitable insulating materials, e.g., silicon oxide. Stack structure 202 can be formed by alternatingly depositing sacrificial material layers and insulating material layers over substrate 201 and subsequently etching each dielectric pair (e.g., including an insulating material layer and an underlying sacrificial material layer) to form staircases along the z-axis. The deposition of sacrificial material layers and insulating material layers can include any suitable deposition methods such as chemical vapor deposition (CVD), physical vapor deposition (PVD), plasma-enhanced CVD (PECVD), sputtering, metal-organic chemical vapor deposition (MOCVD), and/or atomic layer deposition (ALD). In some embodiments, the sacrificial material layers and the insulating material layers are each formed by CVD.

Figure 3A:
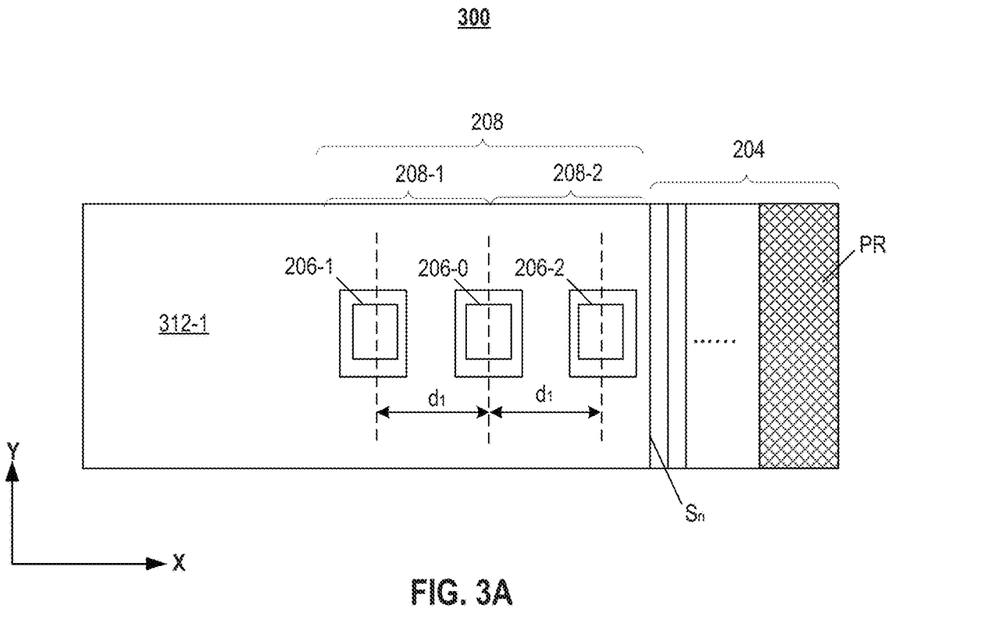
FIG. 3A illustrates a top view of an exemplary marking pattern, according to some embodiments of the present disclosure.
Figure 3B:
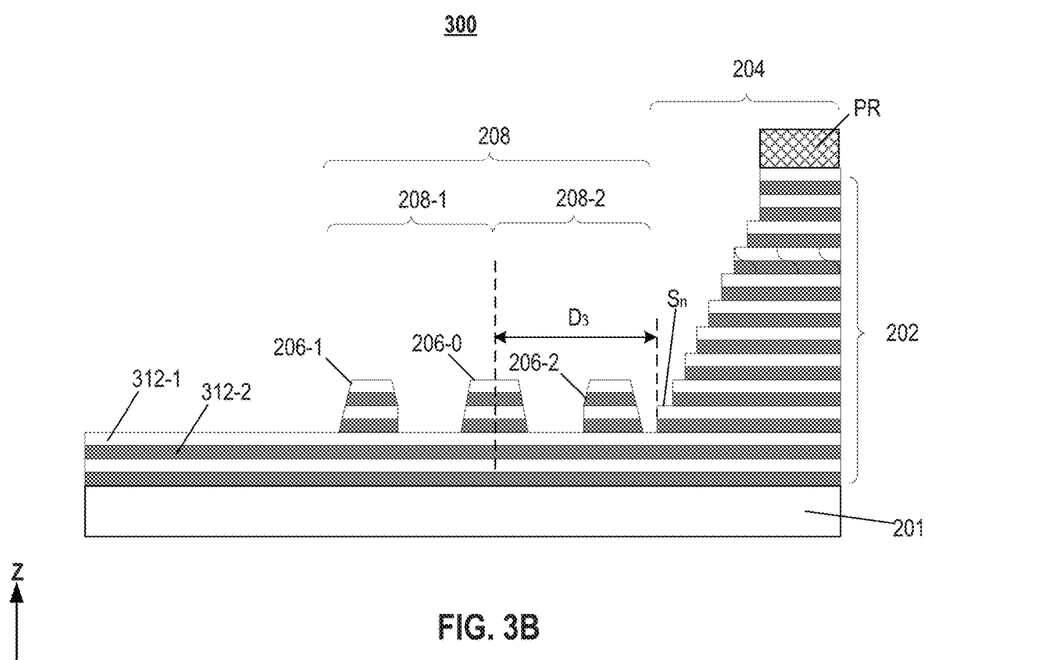
FIG. 3B illustrates a cross-sectional view of the exemplary marking pattern shown in FIG. 3A, according to some embodiments of the present disclosure.
Figure 3C:
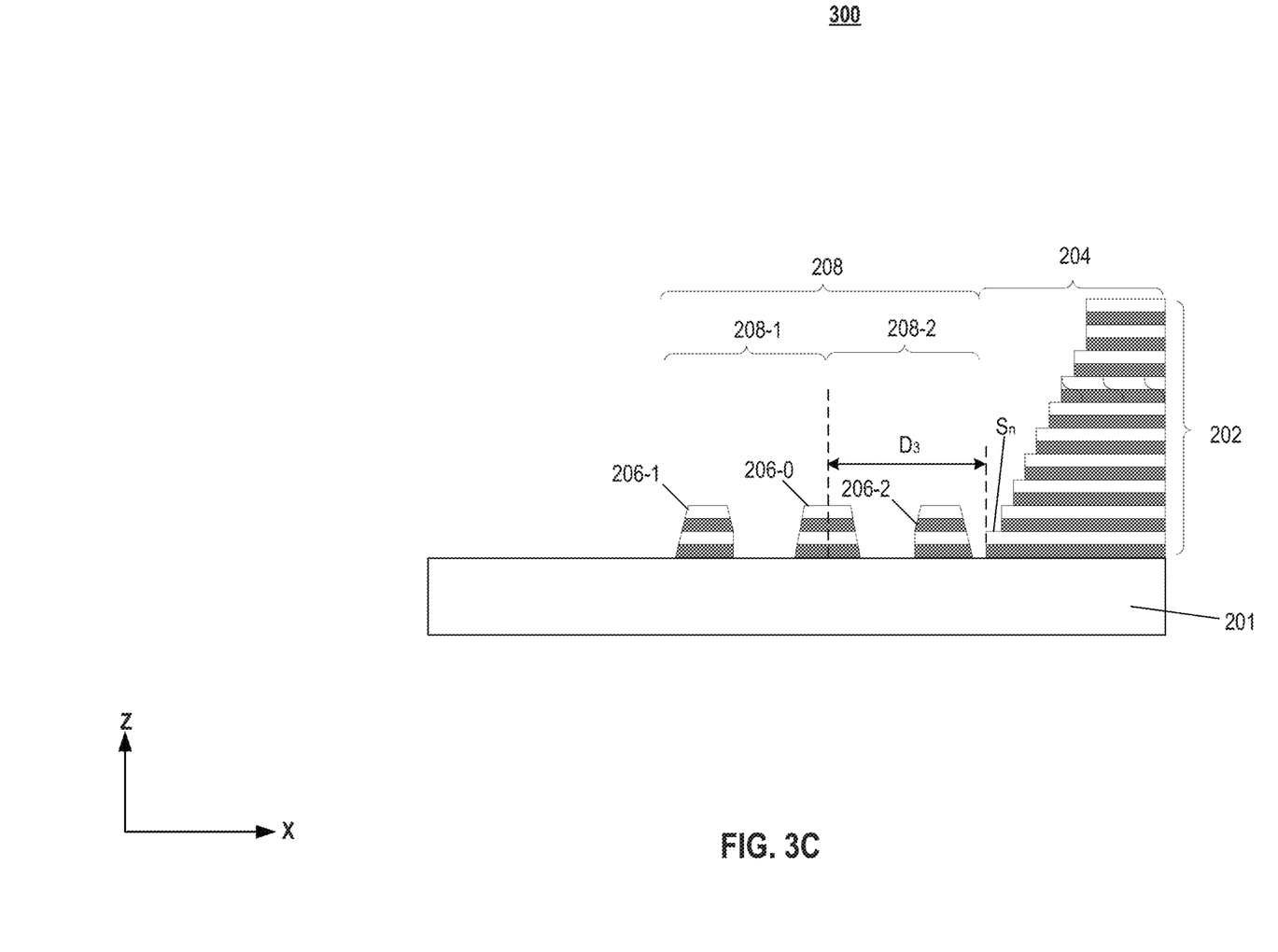
FIG. 3C illustrates a cross-sectional view of the exemplary marking pattern shown in FIGS. 3A and 3B, and a 3D memory device, according to some embodiments of the present disclosure.
Figure 4A:
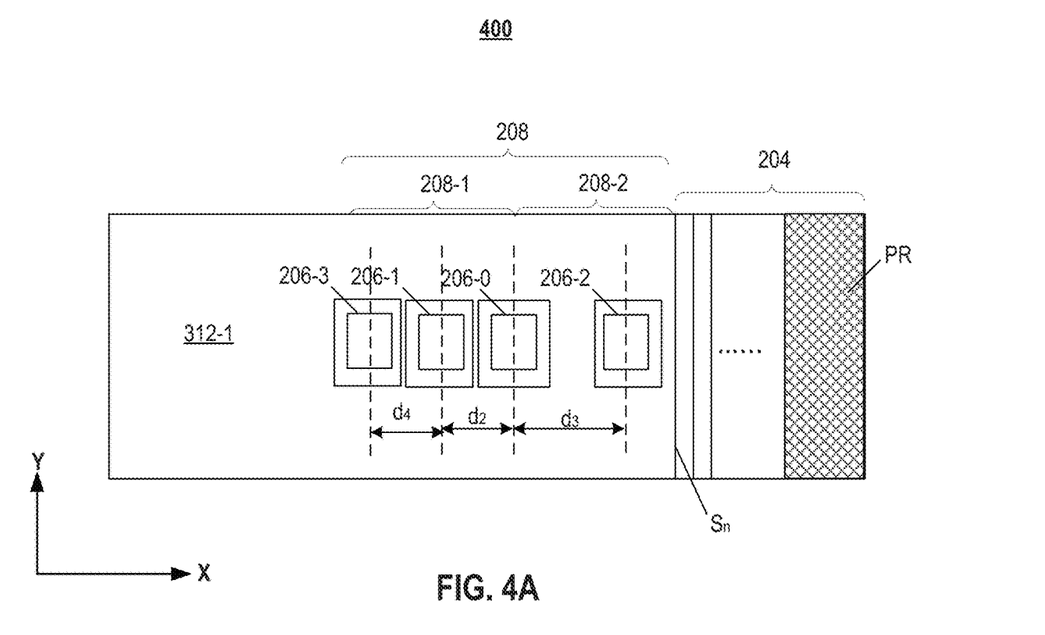
FIG. 4A illustrates a top view of another exemplary marking pattern, according to some embodiments of the present disclosure.
Figure 4B:
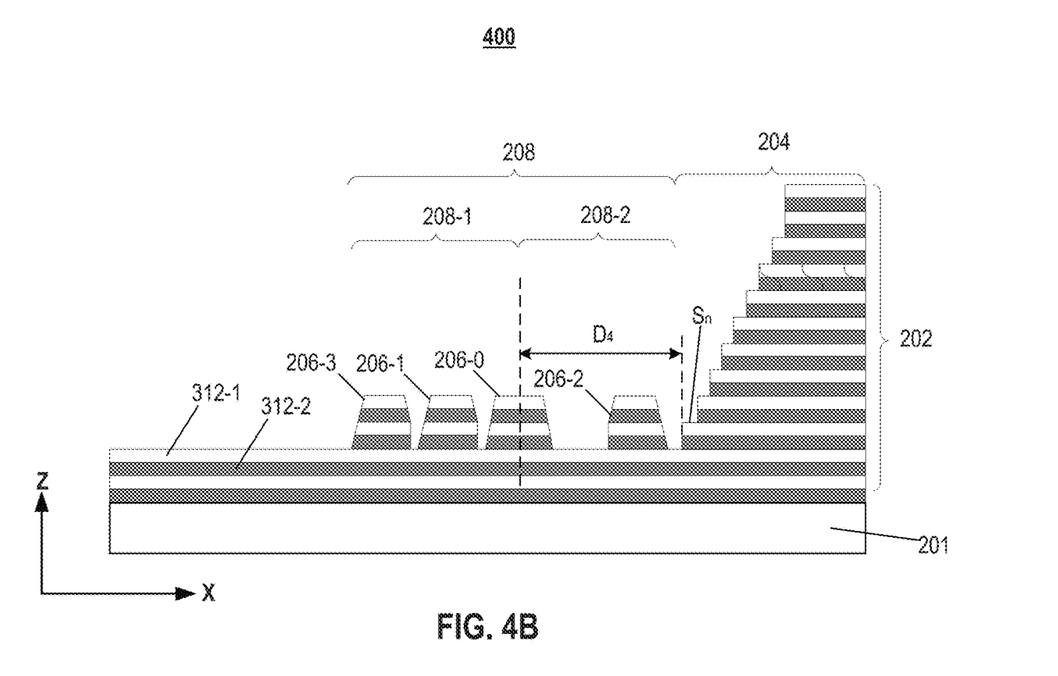
FIG. 4B illustrates a cross-sectional view of the other exemplary marking pattern shown in FIG. 4A, according to some embodiments of the present disclosure.
Figure 4C:
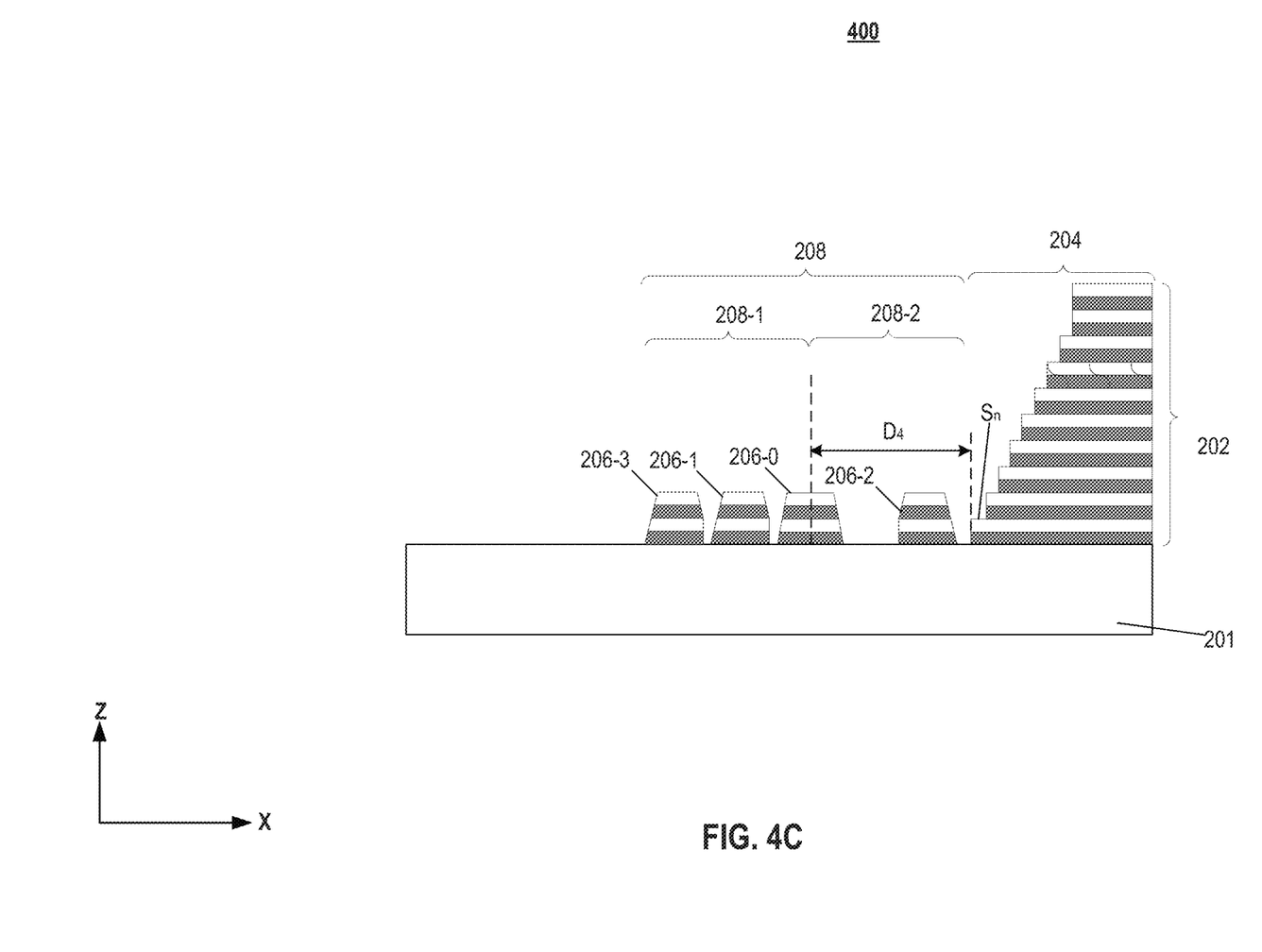
FIG. 4C illustrates a cross-sectional view of the other exemplary marking pattern shown in FIGS. 4A and 4B, and a 3D memory device, according to some embodiments of the present disclosure.

Marking pattern 206 may include a plurality of marking structures (e.g., 206-0, 206-1, and 206-2) located neighboring stack structure 202 over substrate 201. The layout of the marking structures in marking pattern 206 can reduce the loading effect on the marking structure that is used as the reference for determining a trimming rate of the PR layer. The actual number of marking structures is not reflected in marking pattern 206 shown in FIG. 2. FIGS. 3A-3C illustrate a first layout 300 of marking pattern 206. FIGS. 4A-4C illustrate a second layout 400 of marking pattern 206.

FIG. 3A illustrates a top view of first layout 300 of marking pattern 206 during a formation of staircases, according to some embodiments. FIG. 3B illustrates a cross-sectional view of first layout 300 during the formation of staircases, according to some embodiments. FIG. 3C illustrates a cross-sectional view of first layout 300 after the formation of staircases, according to some embodiments. As shown in FIGS. 3A and 3B, during the formation of staircases in stack structure 202, a PR layer (e.g., "PR" in FIGS. 3A and 3B) is trimmed repetitively and functioning as an etching mask for the etching of staircases. Stack structure 202 may include a plurality of insulating material layers 312-1 and sacrificial material layers 312-2 arranged alternatingly over substrate 201.

Marking pattern 206 may be located in marking area 208 and may include a central marking structure 206-0. A central line of central marking structure 206-0 may be used as a reference to determine a trimming rate of the PR layer. In some embodiments, central marking structure 206-0 (or the central line of central marking structure 206-0) divides marking area 208 into a first marking sub-area 208-1 and a second marking sub-area 208-2. First marking sub-area 208-1 may be farther away from stack structure 202 (or the PR layer). Second marking sub-area 208-2 may be closer to stack structure 202 (or the PR layer). In some embodiments, a pattern density of first marking sub-area 208-1 is nominally the same as a pattern density of second marking sub-area 208-2. The same pattern density of first marking sub-area 208-1 and second marking sub-area 208-2 may reduce the loading effect on the etching of central marking structure 206-0, resulting in a more evenly etched profile on central marking structure 206-0.

In some embodiments, the size/range of marking area 208 is determined based on the available area that can be used for forming marking area 208 on substrate 101 and/or stack structure 202. First marking sub-area 208-1 and second marking sub-area 208-2 may have the same or different dimensions. In some embodiments, first marking sub-area 208-1 includes one or more first marking structures and second marking sub-area 208-2 includes one or more second marking structures. The number, distribution, shapes, and/or dimensions of respective marking structures in first marking sub-area 208-1 and second marking sub-area 208-2 are arranged to cause the pattern densities of first marking sub-area 208-1 and second marking sub-area 208-2 to be nominally the same. The specific number, distribution, shapes, and/or dimensions of the marking structures in each sub-area should be determined according to different designs and/or fabrication of the 3D memory device and should not be limited by the embodiments of the present disclosure. In some embodiments, central marking structure 206-0 has symmetric dimensions and shapes about the central line. In some embodiments, central marking structure 206-0 includes a plurality of interleaved layers of insulating material and sacrificial material. For example, as shown in FIG. 3B, central marking structure 206-0 includes four interleaved layers of insulating material and sacrificial material (e.g., formed from the patterning of two dielectric pairs in marking area 208).

In an example, as shown in FIGS. 3A and 3B, first marking sub-area 208-1 includes a first marking structure 206-1 and second marking sub-area 208-2 includes a second marking structure 206-2. First marking structure 206-1 and second marking structure 206-2 can be evenly spaced from central marking structure 206-0 along the horizontal direction (e.g., the x-axis). In some embodiments, along the horizontal direction, a distance between the central line of central marking structure 206-0 and a central line of first marking structure 206-1 is the same as a distance between the central line of central marking structure 206-0 and a central line of second marking structure 206-2. The distances are each shown as "$d_1$" in FIG. 3A. In some embodiments, first marking structure 206-1 and second marking structure 206-2 have the same shape and dimensions. That is, first marking structure 206-1 and second marking structure 206-2 are distributed symmetrically on opposite sides of central marking structure 206-0 along the horizontal direction. In some embodiments, first marking sub-area 208-1 and second marking sub-area 208-2 have the same dimensions and areas, and all marking structures (e.g., central marking structure 206-0, first marking structure 206-1, and second marking structure 206-2) in marking area 208 are identical in shapes and dimensions. The marking structures are distributed symmetrically about the central line of central marking structure 208-0 in marking pattern 206. In some embodiments, first marking structures 206-1 are evenly distributed in first marking sub-area 208-1, and second marking structures 206-2 are evenly distributed in second marking sub-area 208-2, respectively by a distance the same as or different from $d_1$. During the etching of staircases, a distance $D_3$ between the central line of central marking structure 206-0 and the edge of the bottom staircase structure $S_n$ has little or no change. That is, central marking structure 206-0 (or the central line of central marking structure 206-0) has little or no change from its original horizontal location.

FIG. 3C illustrates the cross-sectional view of first layout 300 after the etching of the staircases are completed, according to some embodiments. As shown in FIG. 3C, the horizontal dimension (e.g., width) of central marking structure 206-0 has little or no reduction and distance $D_3$ has little or no change. The central line of central marking structure 206-0 can be employed to determine the trimming rate of PR layer with higher precision.

FIG. 4A illustrates a top view of a second layout 400 of marking pattern 206 during a formation of staircases, according to some embodiments. FIG. 4B illustrates a cross-sectional view of second layout 400 during the formation of staircases, according to some embodiments. FIG. 3C illustrates a cross-sectional view of second layout 400 after the formation of staircases, according to some embodiments. Marking pattern 206, marking sub-areas (208-1 and 208-2), and marking structures (e.g., 206-0, . . . , 206-3) may be the same as or different from the corresponding structure illustrated in FIGS. 3A-3C.

Different from marking pattern 206 shown in FIGS. 3A-3C, in marking pattern 206 illustrated in FIG. 4A-4C, the pattern density of first marking sub-area 208-1 is higher than the pattern density of second marking sub-area 208-2. The higher pattern density of first marking sub-area 208-1 may reduce/compensate the loading effect on the etching of central marking structure 206-0, resulting in a more evenly etched profile on central marking structure 206-0. The marking structures in first marking sub-area 208-1 and second marking sub-area 208-2 are distributed asymmetrically the central line of central marking structure 206-0 in first marking sub-area 208-1 and second marking sub-area 208-2. The number, distribution, shapes, and/or dimensions of respective marking structures in first marking sub-area 208-1 and second marking sub-area 208-2 are arranged to cause the pattern density of first marking sub-area 208-1 to be higher than the pattern density of second marking sub-area 208-2. The specific number, distribution, shapes, and/or dimensions of the marking structures in each sub-area should be determined according to different designs and/or fabrication of the 3D memory device and should not be limited by the embodiments of the present disclosure. In some embodiments, central marking structure 206-0 has symmetric dimensions and shapes about the central line. In some embodiments, central marking structure 206-0 includes a plurality of interleaved layers of insulating material and sacrificial material. For example, as shown in FIG. 4B, central marking structure 206-0 includes four interleaved layers of insulating material and sacrificial material (e.g., formed from the patterning of two dielectric pairs in marking area 208).

In an example, as shown in FIGS. 4A and 4B, first marking sub-area 208-1 includes two first marking structures 206-1 and 206-3, and second marking sub-area 208-2 includes one second marking structure 206-2. In some embodiments, first marking sub-area 208-1 is located between central marking structure 206-0 and first marking structure 206-3. In some embodiments, along the horizontal direction, a distance $d_2$ between the central line of central marking structure 206-0 and a central line of first marking structure 206-1 is less than a distance $d_3$ between the central line of central marking structure 206-0 and a central line of second marking structure 206-2. In some embodiments, along the horizontal direction, a distance $d_4$ between the central lines of first marking structures 206-1 and 206-3 is less than distance $d_3$. In some embodiments, first marking structures 206-1 are evenly distributed in first marking sub-area 208-1 respectively by distance $d_4$, and second marking structures 206-2 are evenly distributed in second marking sub-area 208-2 by distance $d_3$. In some embodiments, first marking structures 206-1 and 206-3 have the same shape and dimensions as second marking structure 206-2. In some embodiments, first marking sub-area 208-1 and second marking sub-area 208-2 have the same dimensions and areas, and all marking structures (e.g., central marking structure 206-0, first marking structures 206-1 and 206-3, and second marking structure 206-2) in marking area 208 are identical in shapes and dimensions.

During the etching of staircases, a distance $D_4$ between the central line of central marking structure 206-0 and the edge of the bottom staircase structure $S_n$ has little or no change. That is, central marking structure 206-0 (or the central line of central marking structure 206-0) has little or no change from its original horizontal location.

FIG. 4C illustrates the cross-sectional view of second layout 400 after the etching of the staircases are completed, according to some embodiments. As shown in FIG. 4C, the horizontal dimension (e.g., width) of central marking structure 206-0 has little or no reduction and distance $D_4$ has little or no change. The central line of central marking structure 206-0 can be employed to determine the trimming rate of PR layer with higher precision.

Figure 5A:
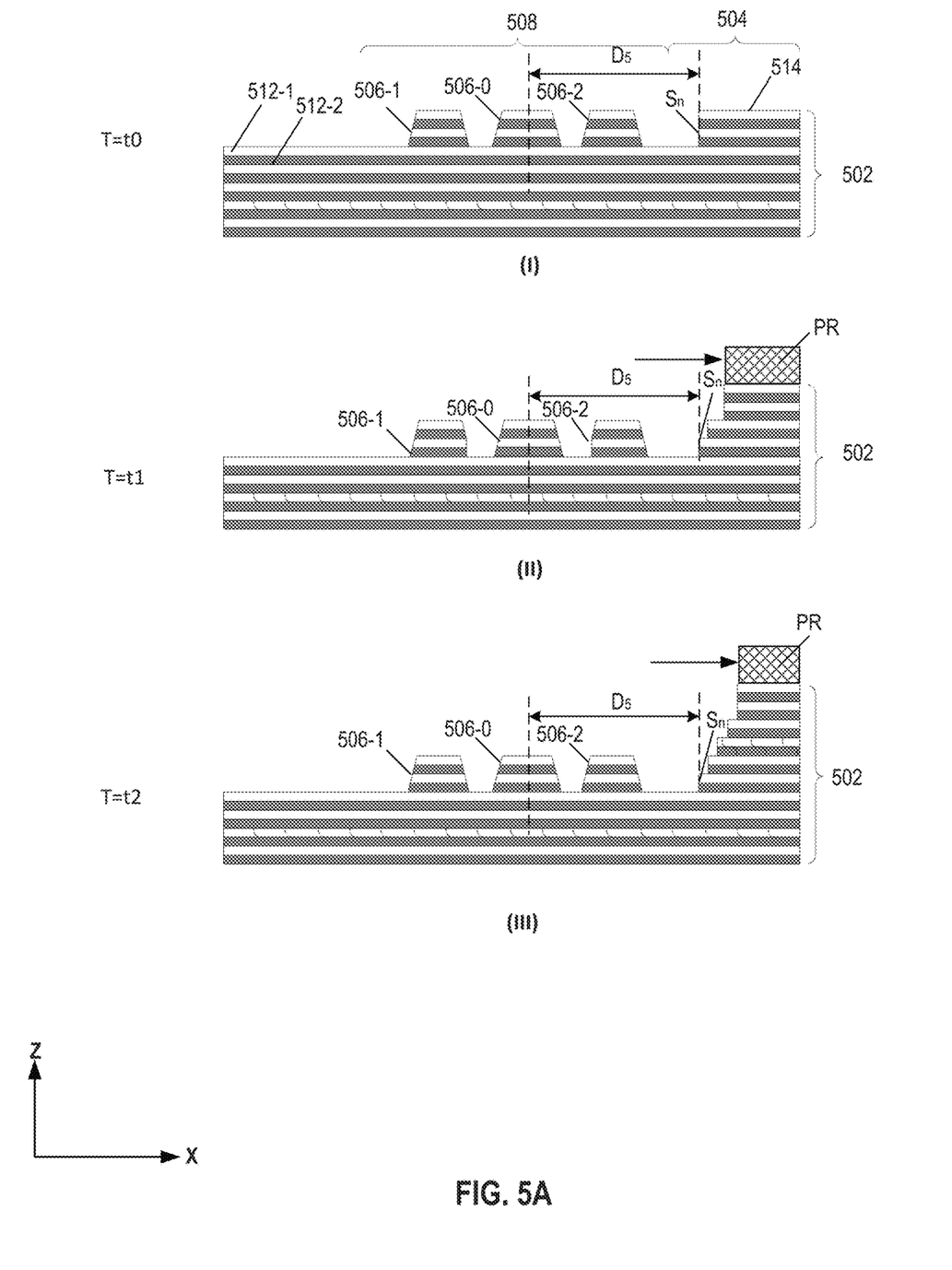
FIGS. 5A and 5B illustrate a fabrication process for forming a 3D memory device using an exemplary marking pattern for trimming rate control of a photoresist layer, according to some embodiments of the present disclosure.
Figure 5B:
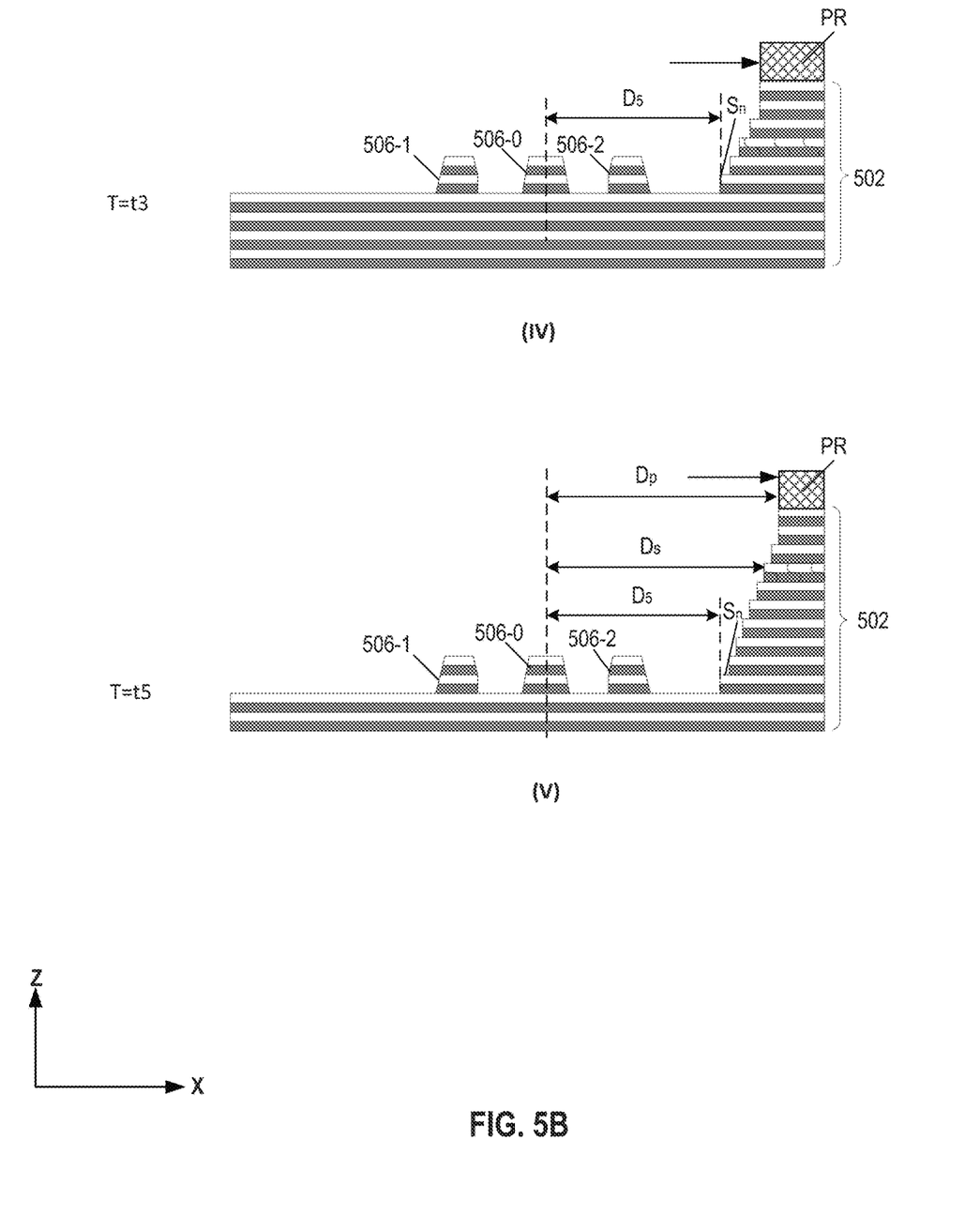
Figure 6:
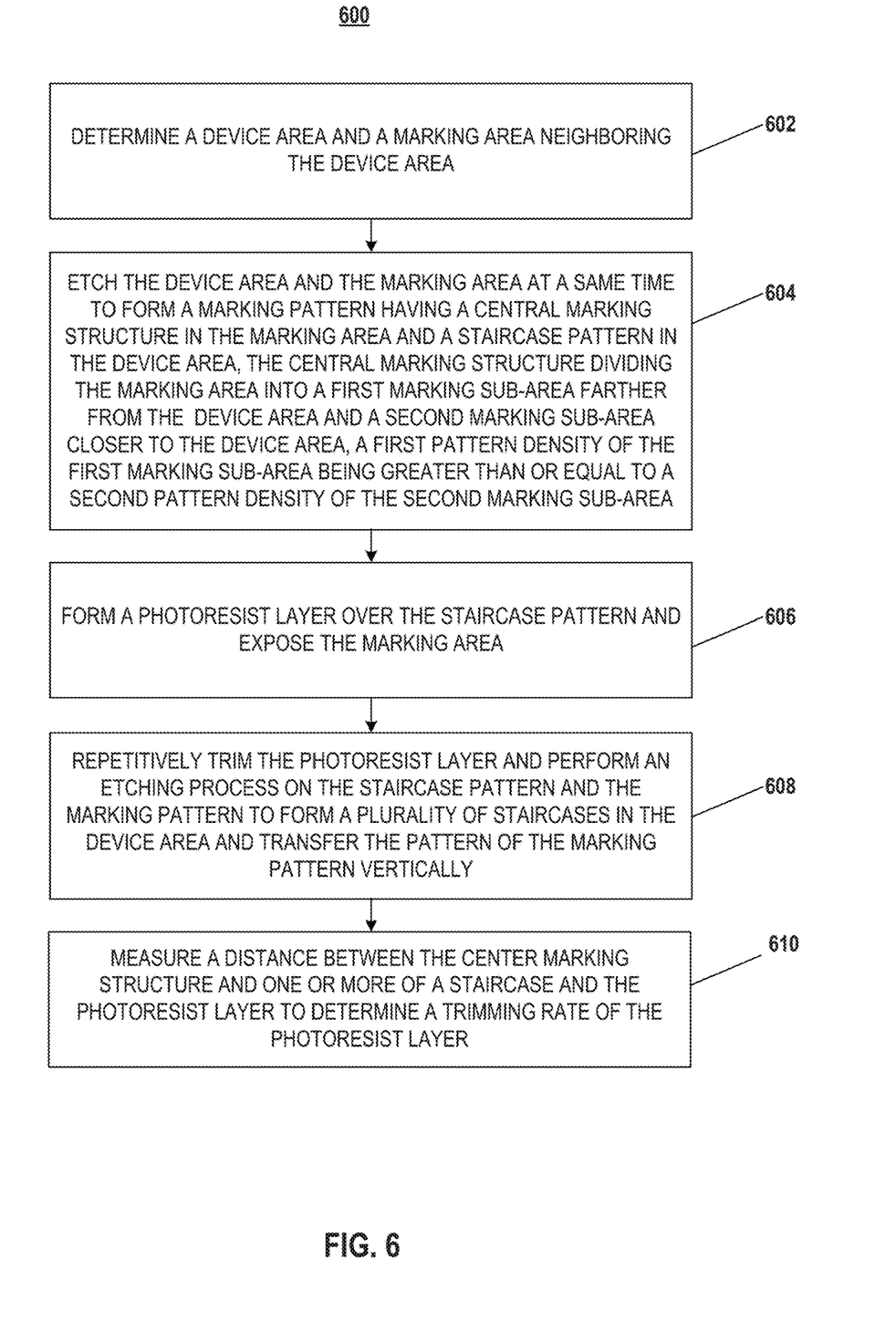
FIG. 6 illustrates a flowchart of an exemplary fabrication process for forming a 3D memory device using an exemplary marking pattern for trimming rate control of a photoresist layer, according to some embodiments of the present disclosure.

FIGS. 5A and 5B illustrate a fabrication process to form a plurality of staircases in a stack structure 502, according to some embodiments. FIG. 5B is a continuation of FIG. 5A. FIG. 6 illustrates a flowchart 600 of the fabrication process described in FIG. 5A and 5B. For illustrative purposes, a marking pattern 506, similar to or the same as marking pattern 206 illustrated in FIGS. 3A-3C, is illustrated in FIGS. 5A and 5B. Marking pattern 206 illustrated in FIGS. 4A-4C may be formed in a similar fabrication process and is not repeated herein. Stack structure 502 may be the same as or similar to stack structure 202 illustrated in FIGS. 2-4. For simplicity of illustration, a substrate under stack structure 502 is omitted in FIGS. 5A and 5B. In some embodiments, central marking structure 506-0 (or the central line of central marking structure 506-0) can be used as a reference to determine the trimming rate of the PR layer during the formation of staircases.

As shown in FIG. 6, at the beginning of the fabrication process, a device area and a marking area neighboring the device area are determined (Operation 602), and patterning process is performed to form a marking pattern in the marking area and a staircase pattern in the device area (Operation 604). FIG. 5A illustrates a corresponding structure.

As shown in the process (I) of FIG. 5A, at T=t0, a device area 504 and a marking area 508 over a stack structure 502 are determined. Marking area 508 may be neighboring device area 504 over stack structure 502, which includes a plurality of interleaved insulating material layers 512-1 (similar to or the same as insulating material layers 312-1) and sacrificial material layers 512-2 (similar to or the same as sacrificial material layers 312-2) stacking over a substrate (not shown).

A patterning process may be performed to form a staircase pattern 514 in device area 504 and a marking pattern 506 in marking area 508. In some embodiments, a photolithography process is performed to exposed portions of stack structure 502, and a suitable etching process is performed to remove the exposed portions of stack structure 502 until a desired thickness of marking pattern 506 or staircase pattern 514 is reached. For example, a timed etching process and/or a selective etching process may be performed to remove portions of insulating material layers 512-1 and sacrificial material layers 512-2. The etching process may include a wet etch and/or a dry etch. In some embodiments, marking pattern 506 and staircase pattern 514 have the same thickness along the vertical direction (e.g., the z-axis), which includes the thickness of at least one dielectric pair. In some embodiments, marking pattern 506 and staircase pattern 514 each has the thickness equal to the thickness of two dielectric pairs, e.g., having two layers of insulating material and two layers of sacrificial material layer interleaved along the vertical direction.

In some embodiments, marking pattern 506 includes a central marking structure 506-0 that divides marking area 508 into a first marking sub-area 508-1 farther away from device area 504 and a second marking sub-area 508-2 closer to device area 504. The pattern density of first marking sub-area 508-1 may be greater than or equal to the pattern density of second marking sub-area 508-2. In some embodiments, the pattern density of first marking sub-area 508-1 is the same as the pattern density of second marking sub-area 508-2. In some embodiments, first marking sub-area 508-1 includes a first marking structure 506-1 and second marking sub-area 508-2 includes a second marking substrate 506-2. The specific pattern of marking pattern 506 may be referred to the description of marking pattern 206 in FIGS. 2-4 and is not repeated herein.

Referring back to FIG. 6, a photoresist layer is formed over the staircase pattern, exposing the marking area (Operation 606) and the photoresist layer is repetitively trimmed and used as the etch mask to form a plurality of staircases in the stack structure (Operation 608). FIGS. 5A and 5B illustrate corresponding structures.

As shown in the process (II) of FIG. 5A, at T=t1, a PR layer is formed to cover staircase pattern 514. The PR layer exposes marking area 508. The PR layer is repetitively trimmed and used as an etch mask to form a plurality of staircases in stack structure 502. A suitable etching process (e.g., dry etch) may be performed to remove the exposed portions of stack structure 502, forming staircases in stack structure 502, and transfer the pattern of marking pattern 506 along the vertical direction. As shown in FIGS. 5A-5B, processes (II)-(V) illustrate the formation of staircases and the pattern transfer of marking pattern 506 from T=t2 to T=t5. A distance $D_s$ between central marking structure 506-0

(or the central line of central marking structure 506-0) and the edge of bottom staircase $S_n$ may have little or no change during the etching of stack structure (e.g., pattern transfer of marking pattern 506).

Referring back to FIG. 6, a distance between the central marking structure and one or more of a staircase and the PR layer can be measured to determine a trimming rate of the photoresist layer (Operation 610). FIG. 5B illustrates a corresponding structure.

In some embodiments, a distance $D_s$ between central marking structure 506-0 and a staircase and/or a distance $D_p$ between central marking structure 506-0 and the PR layer can be measured, e.g., during or after the trimming and etching process, using a suitable monitoring means, to determine the trimming rate of the PR layer. The staircase can be any desired staircase that has been formed. Distance $D_s$ may reflect the horizontal location of the edge of the staircase, which relates to the amount and rate at which the PR layer is being trimmed. In some embodiments, distance $D_s$ may be compared with a reference value to determine whether the PR is trimmed at a desired trimming rate and/or whether the staircase is formed at a desired horizontal location. In some embodiments, distance $D_p$ is measured in real time to determine whether the PR layer is trimmed at a desired trimming rate. In some embodiments, distance $D_p$ may be repetitively measured to determine the trimming rate of the PR layer. For example, the trimming rate of the PR layer from T=t3 to T=t5 can be calculated as $\Delta D_p/(t5-t3)$, where $\Delta D_p$ represents the difference in distance $D_p$ at T=t3 and T=t5. The specific methods to use central marking structure 506-0 for determining the trimming rate of the PR should not be limited by the embodiments of the present disclosure. In some embodiments, PR trimming parameters, e.g., pressure, gas flow, and/or temperature, can be controlled and/or adjusted so the actual PR trimming rate can approach a desired PR trimming rate.

In some embodiments, a semiconductor device includes a stack structure having a plurality of insulating layers and a plurality of conductor layers arranged alternatingly over a substrate along a vertical direction. In some embodiments, the semiconductor device also includes a marking pattern having a plurality of interleaved layers of different materials over the substrate and neighboring the stack structure. The marking pattern includes a central marking structure located in a marking area, the central marking structure dividing the marking area into a first marking sub-area farther from the stack structure and a second marking sub-area closer to the stack structure, a first pattern density of the first marking sub-area being higher than or equal to a second pattern density of the second marking sub-area.

In some embodiments, the first marking sub-area includes at least one first marking structure and the second marking sub-area includes at least one second marking structure and a number of the at least one first marking structure is greater than or equal to a number of the at least one second marking structure. In some embodiments, each of the central marking structure, the at least one first marking structure, and the at least one second marking structure includes the plurality of interleaved layers of a first material and a second material, the first material being different from the second material.

In some embodiments, the first pattern density of the first marking sub-area is equal to the second pattern density of the second marking sub-area, and the at least one first marking structure and the at least one second marking structure are symmetrically distributed on opposite sides of the central marking structure along the horizontal direction.

In some embodiments, the number of the at least one first marking structure is equal to the number of the at least one second marking structure.

In some embodiments, the at least one first marking structure and the at least one second marking structure have same shapes and same dimensions, the central marking structure and the at least one first marking structure are evenly arranged along the horizontal direction by a same distance in the first marking sub-area, and the central marking structure and the at least one second marking structure are evenly arranged along the horizontal direction by the same distance in the second marking sub-area.

In some embodiments, the first pattern density of the first marking sub-area is greater than the second pattern density of the second marking sub-area, and the at least one first marking structure and the at least one second marking structure are asymmetrically distributed on opposite sides of the central marking structure along the horizontal direction.

In some embodiments, the number of the at least one first marking structure is greater than the number of the at least one second marking structure.

In some embodiments, the at least one first marking structure and the at least one second marking structure have same shapes and same dimensions. In some embodiments, along the horizontal direction, a distance between two of the at least one first marking structure is less than a distance between two of the at least one second marking structure.

In some embodiments, along the horizontal direction, the central marking structure and the at least one first marking structure are evenly distributed by a first distance in the first marking sub-area, and the central marking structure and the at least one second marking structure are evenly distributed by a second distance in the second marking sub-area, the first distance being less than the second distance.

In some embodiments, the stack structure includes a staircase structure, each of the plurality of insulating layers and a corresponding conductor layer forming a staircase of the staircase structure.

In some embodiments, a height of the central marking structure is equal to a thickness of at least one staircase along the vertical direction.

In some embodiments, a marking pattern for controlling a trimming rate of a photoresist trimming process includes a plurality of interleaved layers, the plurality of interleaved layers including at least two layers of different materials stacking along a vertical direction over a substrate. In some embodiments, the marking pattern also includes a central marking structure that divides the marking area into a first marking sub-area farther from a device area and a second marking sub-area closer to the device area, a first pattern density of the first marking sub-area being higher than or equal to a second pattern density of the second marking sub-area.

In some embodiments, the first marking sub-area includes at least one first marking structure, and the second marking sub-area includes at least one second marking structure, a number of the at least one first marking structure being greater than or equal to a number of the at least one second marking structure.

In some embodiments, the first pattern density of the first marking sub-area is equal to the second pattern density of the second marking sub-area, and the at least one first marking structure and the at least one second marking structure are symmetrically distributed on opposite sides of the central marking structure along the horizontal direction.

In some embodiments, the number of the at least one first marking structure is equal to the number of the at least one second marking structure.

In some embodiments, the at least one first marking structure and the at least one second marking structures have same shapes and same dimensions, and the central marking structure and the at least one first marking structure are evenly arranged along the horizontal direction by a same distance in the first marking sub-area. In some embodiments, the central marking structure and the at least one second marking structure are evenly arranged along the horizontal direction by the same distance in the second marking sub-area.

In some embodiments, the first pattern density of the first marking sub-area is greater than the second pattern density of the second marking sub-area, and the at least one first marking structure and the at least one second marking structure are asymmetrically distributed on opposite sides of the central marking structure along the horizontal direction.

In some embodiments, the number of the at least one first marking structure is greater than the number of the at least one second marking structure.

In some embodiments, the at least one first marking structure and the at least one second marking structure have same shapes and same dimensions. In some embodiments, along the horizontal direction, a distance between two of the at least one first marking structure is less than a distance between two of the at least one second marking structure.

In some embodiments, along the horizontal direction, the central marking structure and the at least one first marking structure are evenly distributed by a first distance in the first marking sub-area, and the central marking structure and the at least one second marking structure are evenly distributed by a second distance in the second marking sub-area, the first distance being less than the second distance.

In some embodiments, a method for forming a semiconductor device includes the following operations. First, a device area and a marking area neighboring the device area over a dielectric stack are determined, the dielectric stack including a plurality of insulating material layers and a plurality of sacrificial material layers arranged alternatingly over a substrate. The device area and the marking area may be patterned using a same etching process to form a marking pattern having a central marking structure in a marking area and a staircase pattern in the device area. The marking pattern and the staircase pattern may have a same thickness equal to a thickness of at least one insulating material layer and one sacrificial material layer and the central marking structure divides the marking area into a first marking sub-area farther from the device area and a second marking sub-area closer to the device area. A first pattern density of the first marking sub-area may be greater than or equal to a second pattern density of the second marking sub-area. A photoresist layer may be formed to cover the staircase pattern and expose the marking pattern, and the photoresist layer may be trimmed to expose a portion of the dielectric stack along a horizontal direction. An etching process may be performed to maintain the marking pattern and remove the exposed portion of the dielectric stack and form a staircase.

In some embodiments, forming the marking pattern includes forming at least one first marking structure in the first marking sub-area and forming at least one second marking structure in the second marking sub-area. A number of the at least one first marking structure may be greater than or equal to a number of the at least one second marking structure.

In some embodiments, forming the marking pattern includes symmetrically forming the at least one first marking structure and the at least one second marking structure evenly distributed on opposite sides of the central marking structure along the horizontal direction. The first pattern density of the first marking sub-area may be equal to the second pattern density of the second marking sub-area.

In some embodiments, forming the marking pattern includes asymmetrically forming the at least one first marking structure and the at least one second marking structure on opposite sides of the central marking structure along the horizontal direction, the first pattern density of the first marking sub-area being greater than the second pattern density of the second marking sub-area.

In some embodiments, forming the marking pattern includes removing portions of at least one insulating material layer and at least one sacrificial material layer in the marking area to form the central marking structure, the at least one first marking structure, and the at least one second marking structure.

In some embodiments, forming a staircase includes removing a portion of one of the plurality of insulating material layers and a portion of one of the plurality of sacrificial material layers to respectively form an insulating layer and a corresponding sacrificial layer.

In some embodiments, the method further includes measuring a distance between the central marking structure and the photoresist layer.

In some embodiments, the method further includes trimming the photoresist layer to expose another portion of the dielectric stack along the horizontal direction, performing another etching process to transfer a pattern of the marking pattern and remove the other exposed portion of the dielectric stack to form another staircase, measuring another distance between the central marking structure and the photoresist layer, and determining an etch rate of the trimming of the photoresist layer based on the respective distance between the distance, the other distance, and a time interval between times at which the photoresist is trimmed to form the first distance and the other distance.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A semiconductor device comprising:
a stack structure comprising a plurality of insulating layers and a plurality of conductor layers arranged alternatingly over a substrate along a vertical direction; and
a marking pattern having a plurality of interleaved layers of different materials over the substrate and neighboring the stack structure, wherein:
the marking pattern comprises a central marking structure located in a marking area, the central marking structure is a single stack consisting of the plurality of interleaved layers of different materials and dividing the marking area into a first marking sub-area farther from the stack structure and a second marking sub-area closer to the stack structure, and
a first pattern density of the first marking sub-area is higher than or equal to a second pattern density of the second marking sub-area.

2. The semiconductor device of claim 1, wherein
the first marking sub-area comprises at least one first marking structure and the second marking sub-area comprises at least one second marking structure;
a number of the at least one first marking structure is greater than or equal to a number of the at least one second marking structure; and
each of the central marking structure, the at least one first marking structure, and the at least one second marking structure comprises the plurality of interleaved layers of a first material and a second material, the first material being different from the second material.

3. The semiconductor device of claim 2, wherein
the first pattern density of the first marking sub-area is equal to the second pattern density of the second marking sub-area; and
the at least one first marking structure and the at least one second marking structure are symmetrically distributed on opposite sides of the central marking structure along a horizontal direction.

4. The semiconductor device of claim 3, wherein the number of the at least one first marking structure is equal to the number of the at least one second marking structure.

5. The semiconductor device of claim 4, wherein
the at least one first marking structure and the at least one second marking structure have same shapes and same dimensions;
the central marking structure and the at least one first marking structure are evenly arranged along the horizontal direction by a same distance in the first marking sub-area; and
the central marking structure and the at least one second marking structure are evenly arranged along the horizontal direction by the same distance in the second marking sub-area.

6. The semiconductor device of claim 2, wherein
the first pattern density of the first marking sub-area is greater than the second pattern density of the second marking sub-area; and
the at least one first marking structure and the at least one second marking structure are asymmetrically distributed on opposite sides of the central marking structure along the horizontal direction.

7. The semiconductor device of claim 6, wherein the number of the at least one first marking structure is greater than the number of the at least one second marking structure.

8. The semiconductor device of claim 7, wherein
the at least one first marking structure and the at least one second marking structure have same shapes and same dimensions; and
along the horizontal direction, a distance between two of the at least one first marking structure is less than a distance between two of the at least one second marking structure.

9. The semiconductor device of claim 8, wherein along the horizontal direction, the central marking structure and the at least one first marking structure are evenly distributed by a first distance in the first marking sub-area, and the central marking structure and the at least one second marking structure are evenly distributed by a second distance in the second marking sub-area, the first distance being less than the second distance.

10. The semiconductor device of claim 1, wherein the stack structure comprises a staircase structure, each of the plurality of insulating layers and a corresponding conductor layer forming a staircase of the staircase structure.

11. The semiconductor device of claim 10, wherein a height of the central marking structure is equal to a thickness of at least one staircase along the vertical direction.

12. A semiconductor device comprising:
a stack structure comprising a plurality of insulating layers and a plurality of conductor layers arranged alternatingly over a substrate along a vertical direction; and
a marking pattern having a plurality of interleaved layers of different materials over the substrate and neighboring the stack structure, wherein:
the marking pattern comprises a plurality of marking structures disconnected from one another and located in a marking area, and
the plurality of marking structures comprising a central marking structure dividing the marking area into a first marking sub-area farther from the stack structure and a second marking sub-area closer to the stack structure, a first pattern density of the first marking sub-area being higher than or equal to a second pattern density of the second marking sub-area.

13. The semiconductor device of claim 12, wherein
the first marking sub-area comprises at least one first marking structure, and the second marking sub-area comprises at least one second marking structure;
a number of the at least one first marking structure is greater than or equal to a number of the at least one second marking structure; and
each of the central marking structure, the at least one first marking structure, and the at least one second marking structure comprises the plurality of interleaved layers of a first material and a second material, the first material being different from the second material.

14. The semiconductor device of claim 13, wherein
the first pattern density of the first marking sub-area is equal to the second pattern density of the second marking sub-area; and
the at least one first marking structure and the at least one second marking structure are symmetrically distributed on opposite sides of the central marking structure along a horizontal direction.

15. The semiconductor device of claim 14, wherein
the number of the at least one first marking structure is equal to the number of the at least one second marking structure;
the at least one first marking structure and the at least one second marking structure have same shapes and same dimensions;
the central marking structure and the at least one first marking structure are evenly arranged along the horizontal direction by a same distance in the first marking sub-area; and
the central marking structure and the at least one second marking structure are evenly arranged along the horizontal direction by the same distance in the second marking sub-area.

16. The semiconductor device of claim 13, wherein
the first pattern density of the first marking sub-area is greater than the second pattern density of the second marking sub-area; and
the at least one first marking structure and the at least one second marking structure are asymmetrically distributed on opposite sides of the central marking structure along the horizontal direction.

17. The semiconductor device of claim 16, wherein
the number of the at least one first marking structure is greater than the number of the at least one second marking structure;
the at least one first marking structure and the at least one second marking structure have same shapes and same dimensions; and
along the horizontal direction, a distance between two of the at least one first marking structure is less than a distance between two of the at least one second marking structure.

18. A semiconductor device comprising:
a stack structure comprising a plurality of insulating layers and a plurality of conductor layers arranged alternatingly over a substrate along a vertical direction; and
a marking pattern consisting of a plurality of interleaved layers of different materials over the substrate and neighboring the stack structure, wherein:
the marking pattern comprises a plurality of marking structures each being a single stack of the different materials,
the plurality of marking structures comprises a central marking structure located in a marking area, the central marking structure dividing the marking area into a first marking sub-area farther from the stack structure and a second marking sub-area closer to the stack structure, a first pattern density of the first marking sub-area being higher than or equal to a second pattern density of the second marking sub-area.

19. The semiconductor device of claim 18, wherein
the first marking sub-area comprises at least one first marking structure, and the second marking sub-area comprises at least one second marking structure;
a number of the at least one first marking structure is greater than or equal to a number of the at least one second marking structure; and
each of the central marking structure, the at least one first marking structure, and the at least one second marking structure comprises the plurality of interleaved layers of a first material and a second material, the first material being different from the second material.

20. The semiconductor device of claim 19, wherein
the first pattern density of the first marking sub-area is equal to the second pattern density of the second marking sub-area; and
the at least one first marking structure and the at least one second marking structure are symmetrically distributed on opposite sides of the central marking structure along a horizontal direction.

* * * * *